(12) United States Patent
Botti et al.

(10) Patent No.: US 6,307,431 B1
(45) Date of Patent: Oct. 23, 2001

(54) PWM BRIDGE AMPLIFIER WITH INPUT NETWORK CONFIGURABLE FOR ANALOG OR DIGITAL INPUT NOT NEEDING A TRIANGULAR WAVE GENERATOR

(75) Inventors: Edoardo Botti, Vigevano; Antonio Grosso; Marco Masini, both of Milan, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/434,327

(22) Filed: Nov. 4, 1999

(30) Foreign Application Priority Data

Nov. 13, 1998 (EP) .................................................. 98830685

(51) Int. Cl.[7] ...................................................... H03F 3/38
(52) U.S. Cl. ............................................. 330/10; 330/251
(58) Field of Search ........................ 330/10, 251, 207 A, 330/124 R (56) References Cited

U.S. PATENT DOCUMENTS

| | | | |
|---|---|---|---|
| 3,537,022 | * 10/1970 | Regan | 330/10 |
| 4,107,618 | * 8/1978 | Ormond | 330/51 |
| 4,531,096 | * 7/1985 | Yokoyama | 330/10 |
| 5,218,315 | 6/1993 | Turner | 330/10 |
| 5,382,915 | 1/1995 | Muri et al. | 330/10 |

FOREIGN PATENT DOCUMENTS

| | | |
|---|---|---|
| 0 616 422 A1 | 3/1994 | (EP) . |
| 2 096 850 | 4/1982 | (GB) . |

* cited by examiner

*Primary Examiner*—Robert Pascal
*Assistant Examiner*—Henry Choe
(74) *Attorney, Agent, or Firm*—Theodore E. Galanthay; Allen, Dyer, Doppelt, Milbrath & Gilchrist, P.A.

(57) ABSTRACT

A low frequency PWM output bridge amplifier having an input network configurable for standard PWM digital input signals, phase shift PWM digital input signals or analog input signals and for standard PWM output or phase shift PWM output is provided. The amplifier includes two identical amplifying modules. One for the amplifying channel relative to the direct or positive PWM output and the other for the amplifying channel relative to the inverted or negative PWM output. Each module includes a switching output operational amplifier, having a voltage mode noninverting input, a current mode inverting input and a loop filter implementing a single or multiple slope integrator outputting a signal of a substantially triangular waveform. Each module also includes a logic inverter or a cascade of logic inverters coupled in cascade to the output of the integrator and outputting a logic PWM signal, an output power stage converting the logic PWM signal output by the inverter(s) in a PWM signal, switching between the potentials of the two supply rails of the circuit, and a feedback resistor connecting the output of power stage to the inverting input of the operational amplifier.

33 Claims, 12 Drawing Sheets

PWM BRIDGE AMPLIFIER WITH INPUT NETWORK CONFIGURABLE FOR ANALOG OR DIGITAL INPUT NOT NEEDING A TRIANGULAR WAVE GENERATOR

FIELD OF THE INVENTION

The present invention relates to low frequency/high performance amplifiers, commonly referred to as Class-D amplifiers and particularly, though not exclusively, to audio amplifiers.

BACKGROUND OF THE INVENTION

The efforts of consumer device manufacturers to reduce energy consumption, weight and size of heat dissipaters, for example in the field of automobile entertainment devices, have generated a demand for power amplifiers with a greater efficiency than Class-AB amplifiers. Class-D amplifiers have been proposed to respond to these demands. Substantially, Class-D amplifiers include a DC-AC converter circuit which produces a pulse width modulated (PWM) output signal. This pulse width modulated output signal drives power switches, which in turn switch a load which may implement a passive lowpass filter for reconstructing the amplified audio signal, of which the actual load (e.g. a speaker) may be a part. The analysis of the behavior of a single ended amplifier with an analog input and a PWM output (a Class-D amplifier) is described in the paper "Analysis of a quality Class-D amplifier", F. A. Himmelstoss, et al., I.E.E.E. Transactions on Consumer Electronics, Vol. 42, No. 3, August 1996.

On the other hand, the increasing interest in digital audio signal processing, will make it more convenient to use digital amplifiers rather than analog amplifiers. Therefore, many manufacturers of audio equipment require Class-D power amplifiers capable of handling analog audio signals and digital audio signals. According to a common technique, to process an analog input signal requires the generation of a reference waveform, commonly a triangular or a saw-tooth signal, whose generation is relatively critical and at any rate requires a certain circuit complexity.

An example of a Class-D amplifier capable of selectively handling analog audio signals and digital audio signals, is described in U.S. Pat. No. 5,672,998. The amplifier uses a circuit for generating a PWM signal from an analog audio signal, separated from the feedback loop of the power amplifier itself. Even in this case, in order to generate a PWM signal, a triangular reference signal, produced by a dedicated generator, is employed.

SUMMARY OF THE INVENTION

An object of the invention is to provide a Class-D power amplifier capable of handling analog and/or digital input signals (PWM), without requiring generation of a reference (triangular) wave, according to a traditional analog/PWM conversion scheme, or any selfoscillating structures (such as of the so-called BOSE type).

According to an embodiment of the amplifier of the invention, which is simple to adapt to particular user conditions, an input network configurable through a pair of four-position switches, allows for the selection of the input signal, analog or digital (PWM), and a further selection between a PWM-standard digital input or a phase shift PWM digital input, as well as a selection between a standard PWM output or a phase shift PWM output. Of course, the configuration of the appropriate input network may be carried out in a permanent manner or even by the use of external networks without employing any selection switch. Even according to these alternative embodiments, the core of the amplifier of the invention remains the same.

The advantage of a phase shift PWM modulation, wherein the inverted signal is shifted by a half clock period in respect of the noninverted signal, is that the differential output carrier frequency of the PWM power amplifier is twice the clock frequency which is therefore more easily filtered. Moreover, under null modulation conditions, ideally, there are no residues of the carrier signal on the load terminals.

Basically, the amplifier of the invention is composed of two identical amplifying modules, one amplifying channel for the direct (noninverted) PWM signal and the other for the inverted PWM signal. Each module includes a switching output operational amplifier, having a first noninverting voltage input, a second inverting current input and a loop filter forming with the amplifier a single slope or a two-slope integrator. Each module also includes a logic inverter (or cascade of logic inverters) coupled in cascade to the output of the integrator, and an output power stage converting the logic level PWM signal output by the inverter or cascade of logic inverters to an analog signal switching between the potentials of the two supply rails. Also, each module includes a negative feedback resistor coupled between the output of the power stage and the inverting input of the operational amplifier.

BRIEF DESCRIPTION OF THE DRAWINGS

The various aspects and advantages of the invention will become even more evident through the following description of several embodiments and by referring to the annexed drawings, wherein.

DETAILED DESCRIPTION OF THE PREFERRED EMBODIMENTS

Figure 1:
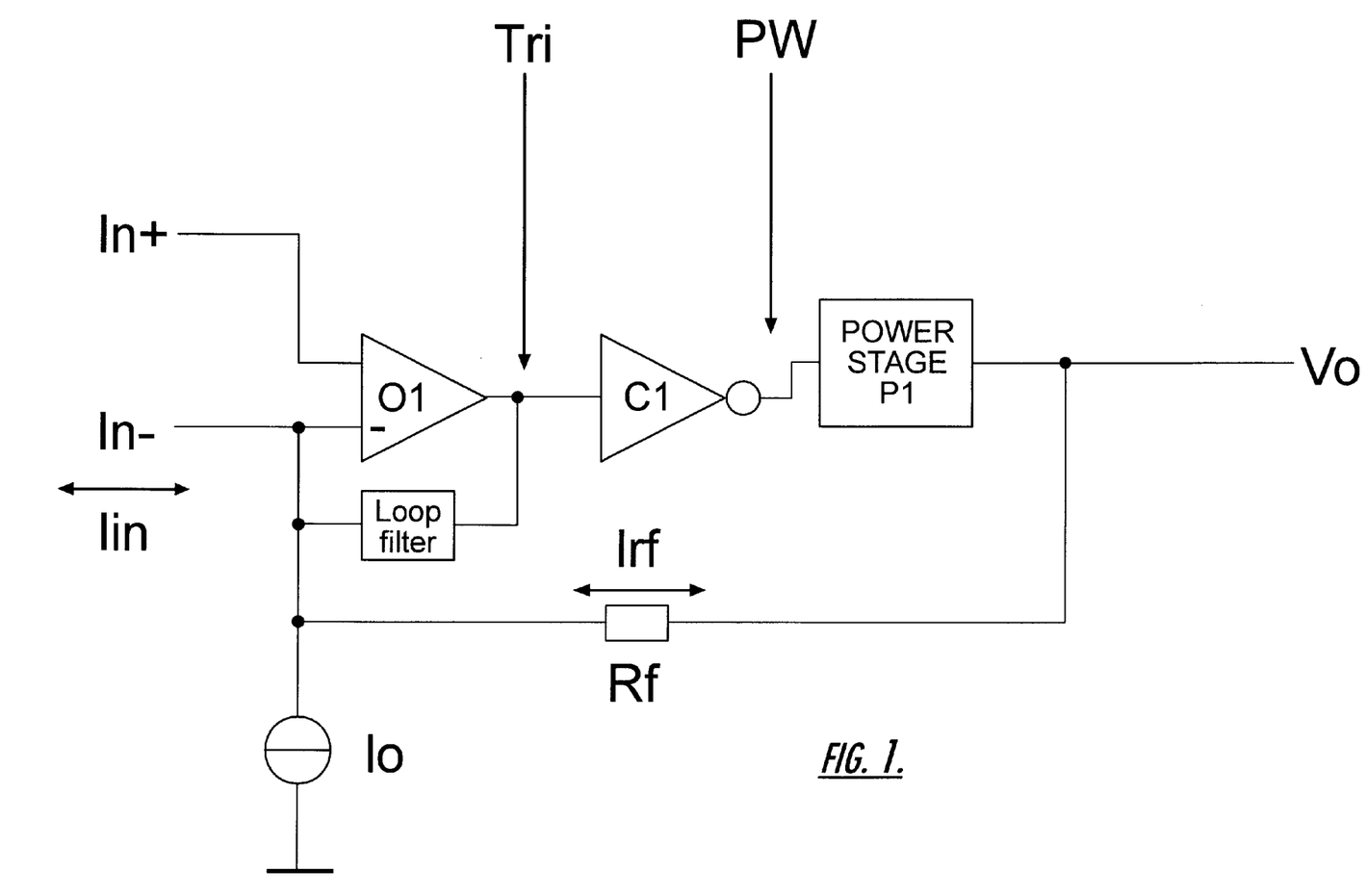
FIG. 1 is a functional diagram of each of the two identical amplifying modules that comprise the amplifier of the invention, according to a first embodiment.

FIG. 1 shows the functional diagram of one of the two identical amplifying modules 1 and 2 that compose the amplifier of the invention, as will be better explained later in this description. Each of the two modules comprises an operational amplifier O1 having a lowpass loop filter thus implementing an integrating stage. The noninverting input In+ is fed in a voltage mode while the inverting input of the amplifier In− is fed in a current mode.

Figure 3A:
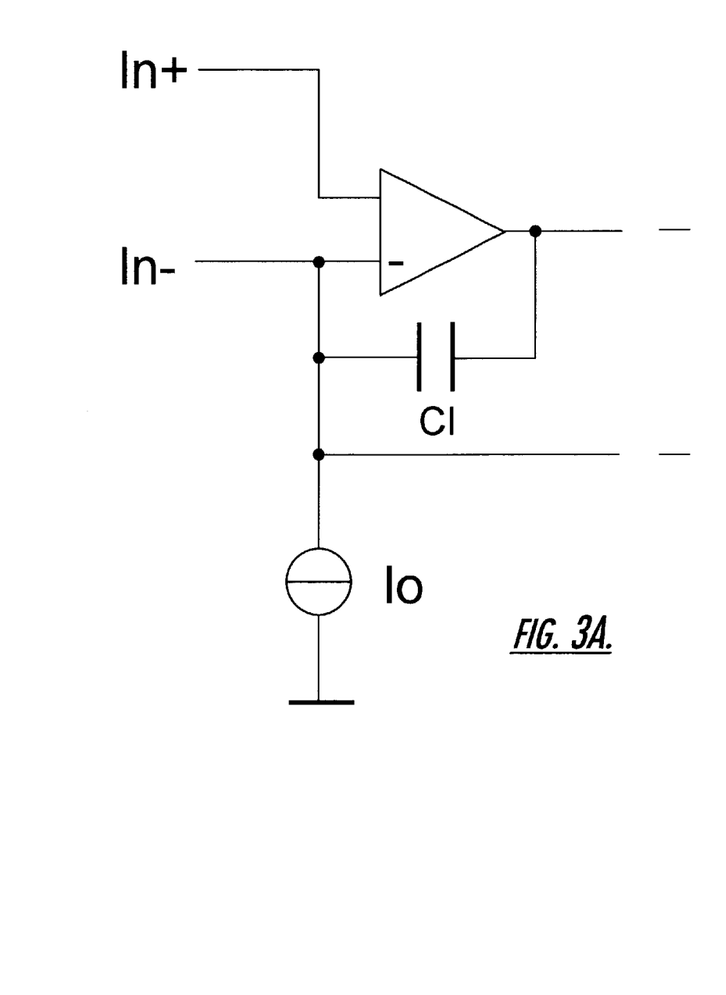
FIGS. 3A and 3B show the two alternative forms of the loop filter of the input integrator of each of the two modules that compose the amplifier of the invention.
Figure 3B:
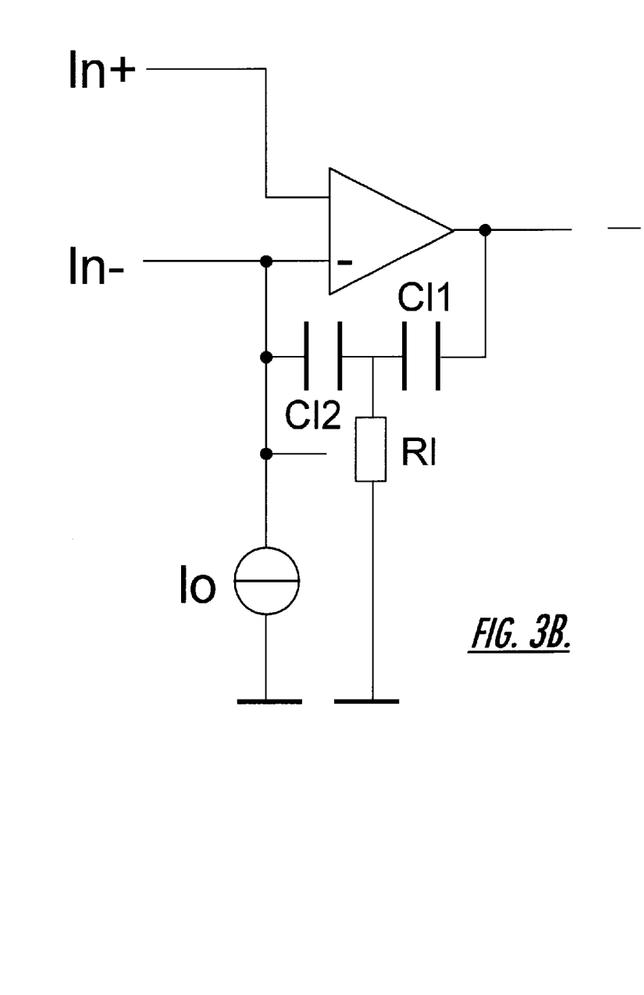

As shown in FIG. 3, the lowpass filter may be include a single integrating capacitor CI connected between the output of the operational amplifier and its inverting input In−, thus implementing a single slope integrator, as depicted in FIG. 3A. Alternatively, the lowpass filter may be a passive network constituted by two capacitors CI1 and CI2 and a resistor RI connected between the intermediate node between the two capacitors in series and the circuit's ground, as shown in FIG. 3B, thus implementing a two-slopes integrator. Use of a multiple slope integrator allows for higher loop gains and therefore for a lower harmonic distortion.

The Rf resistor (FIG. 1) represents a negative feedback resistor while the current generator Io, generating a current whose value depends on the value of the supply voltage, allows for a maximum voltage excursion of the undistorted signal on the filtered outputs (that is, downstream of the analog signal reconstructing filter) of the PWM amplifier. By referring the diagram of the basic module of FIG. 1, on the node Tri, indicated with an arrow, that is, at the output of the integrator, there exist a signal of an approximately triangular waveform the slopes of which depend on the input current, Iin, on the feedback current, Irf, and on the type of loop filter employed. This triangular waveform is compared by the logic block C1 which, as mentioned above, may be a simple NOR logic gate or an inverter or a cascade of them, at the output of which a logic PWM signal is obtained, as indicated by the arrow in the diagram of FIG. 1.

Figure 2:
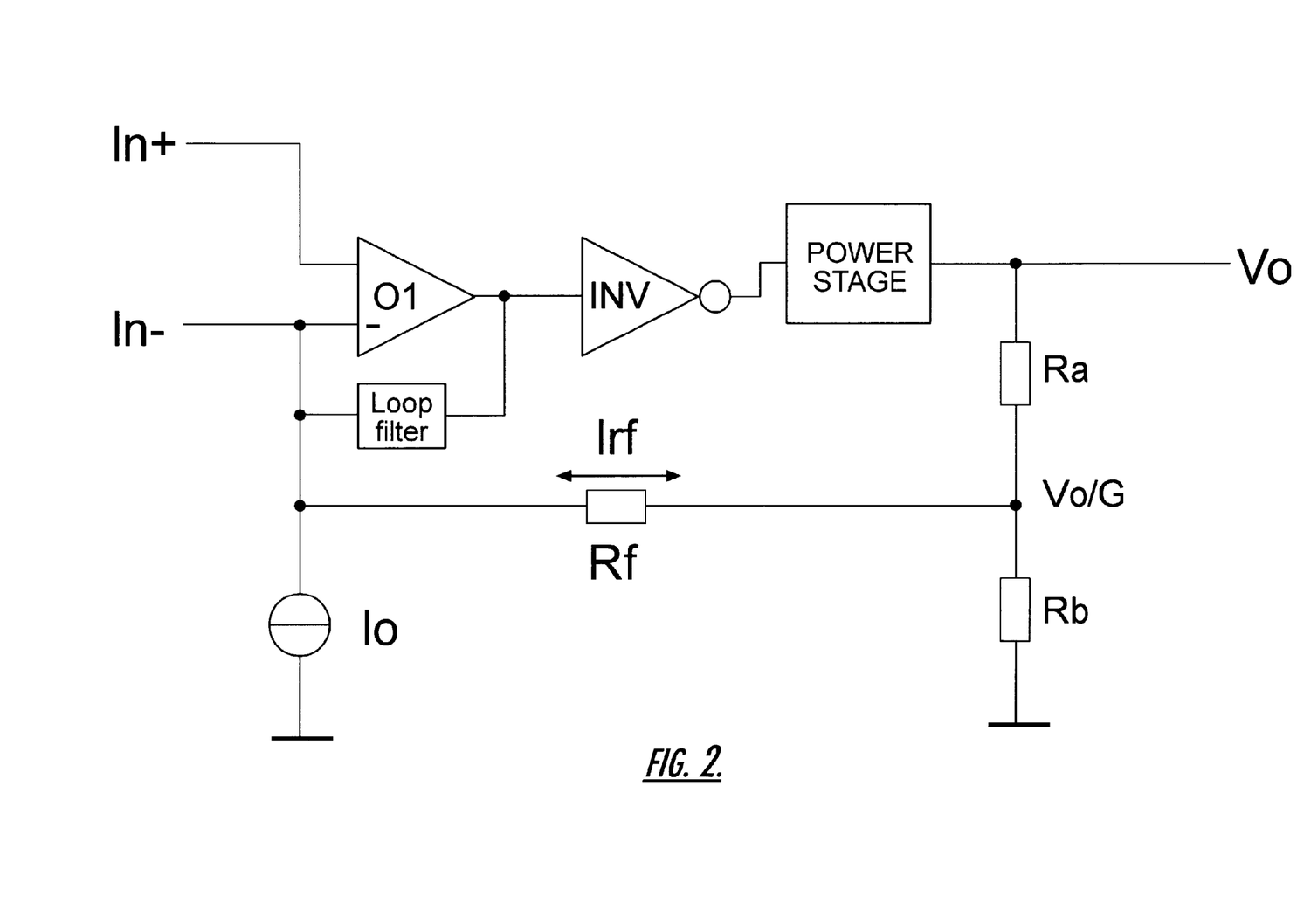
FIG. 2 is a functional diagram of each of the two identical amplifying modules that comprise the amplifier of the invention, according to an alternative embodiment.

An alternative embodiment of the two basic amplifying modules that comprise the amplifier of the invention is shown in FIG. 2. The sole difference in respect to the embodiment of FIG. 1 is represented by the use of a resistive divider, Ra–Rb, connected between the output node of the module and the ground node of the circuit and to the intermediate node of which is connected the feedback resistor Rf. This alternative configuration is particularly useful in case of an embodiment of the amplifier of the invention in the form of a monolithic integrated circuit, because it allows a reduction by a factor equal to the partition ratio given by the respective values of Ra and Rb of the divider, the value of the feedback resistor Rf, thus a consequent reduction of the silicon area required for integrating it.

Figure 4:
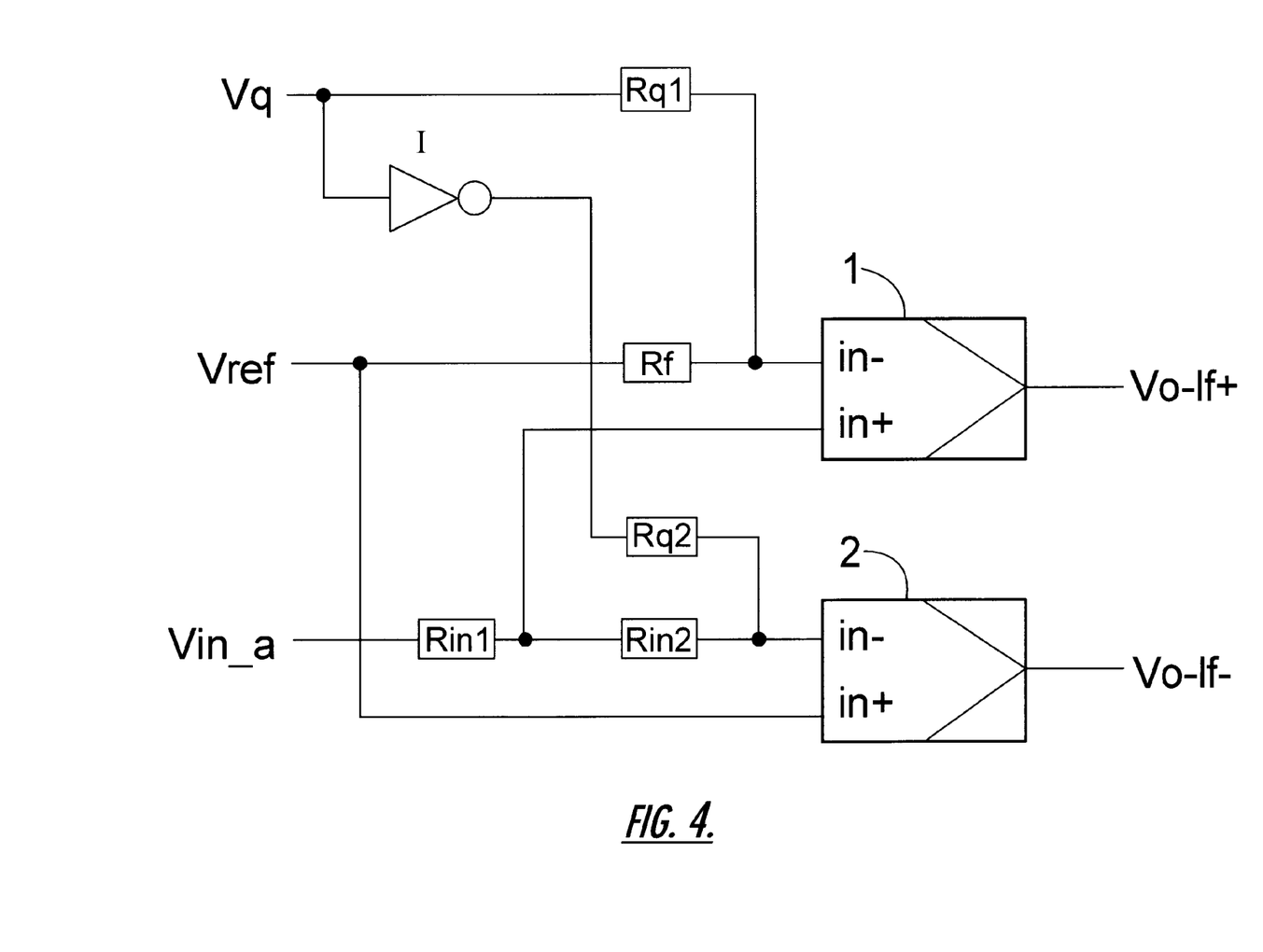
FIG. 4 shows the configuration of the input network for an analog input signal and a standard PWM output.

FIG. 4 shows a complete scheme of the amplifier of the invention configured for the case of an analog input signal and a standard PWM output. Of course, each of the two amplifying modules 1 and 2 that comprise the amplifier of the invention has an identical circuit diagram that may be that of FIG. 1 or FIG. 2. A square wave clock Vq is fed via the resistor Rq1 to the inverting input In− of the module 1, relative to the positive PWM output Vo−If+, while the inverted square wave clock output by the inverter I is fed to the inverting input In− of the second module 2, relative to the negative PWM output Vo−If−. Vref is a fixed reference voltage, for example of 2.5V, while the analog audio signal to be amplified is fed to the input Vin_a.

The partition given by the input resistors Rin1 and Rin2, which feed the input signal to the noninverting channel, takes into consideration the difference of gain between the inverting channel and the noninverting channel, in order to ensure that the two channels saturate simultaneously. The same result could be obtained even by making Rin1=0 and by adequately modifying the value of the feedback resistor Rf of the two amplifying modules 1 and 2.

Figure 5:
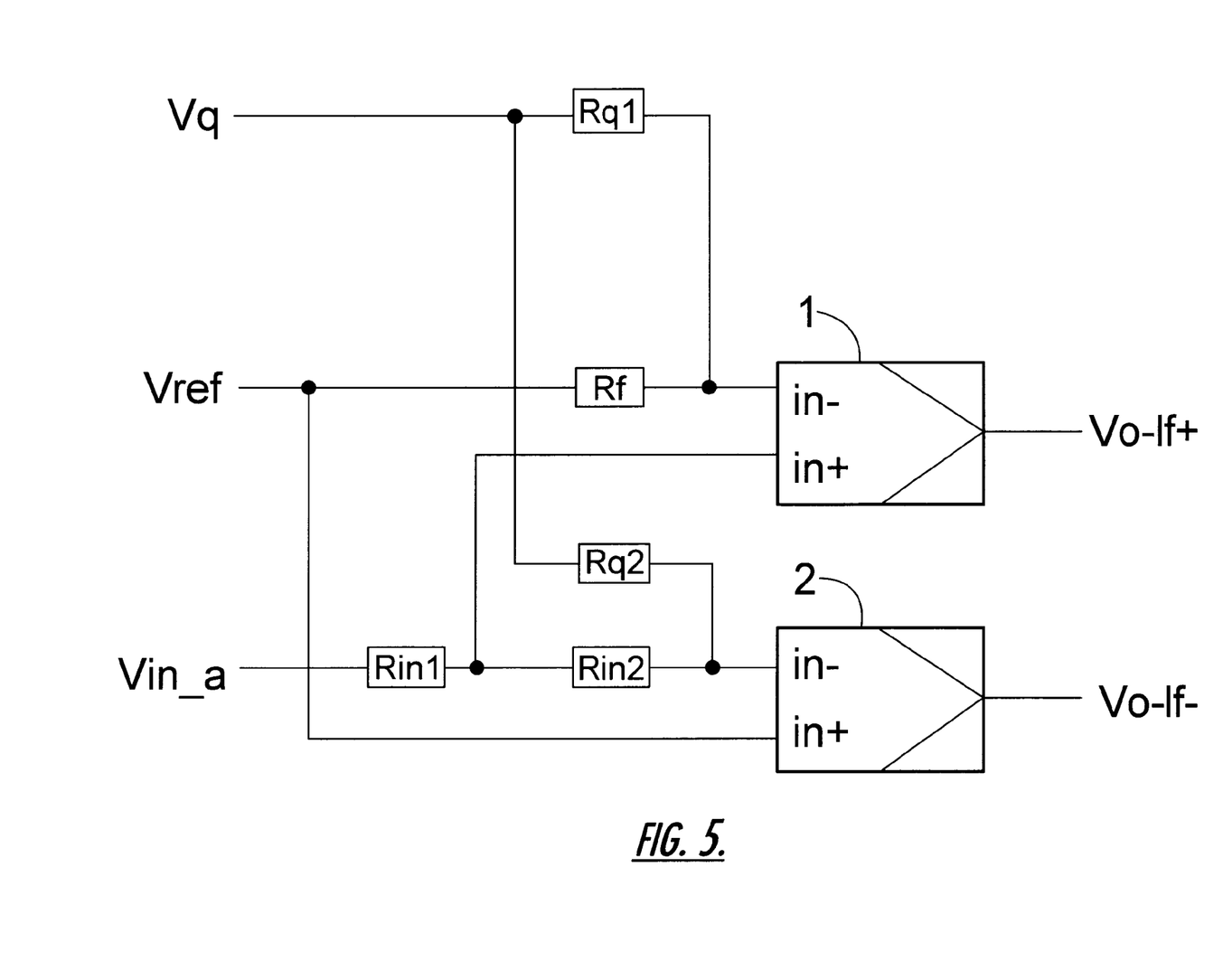
FIG. 5 shows the configuration of the input network for an analog input signal and a phase shift PWM output.

By eliminating the logic inverter I of the square wave clock from the diagram of FIG. 4, an input network configuration of the amplifier as depicted in FIG. 5 is obtained, determining a phase-shift PWM output instead of a standard one (as will be described below). The considerations relative to match the gains of the two channels remain valid.

Figure 6:
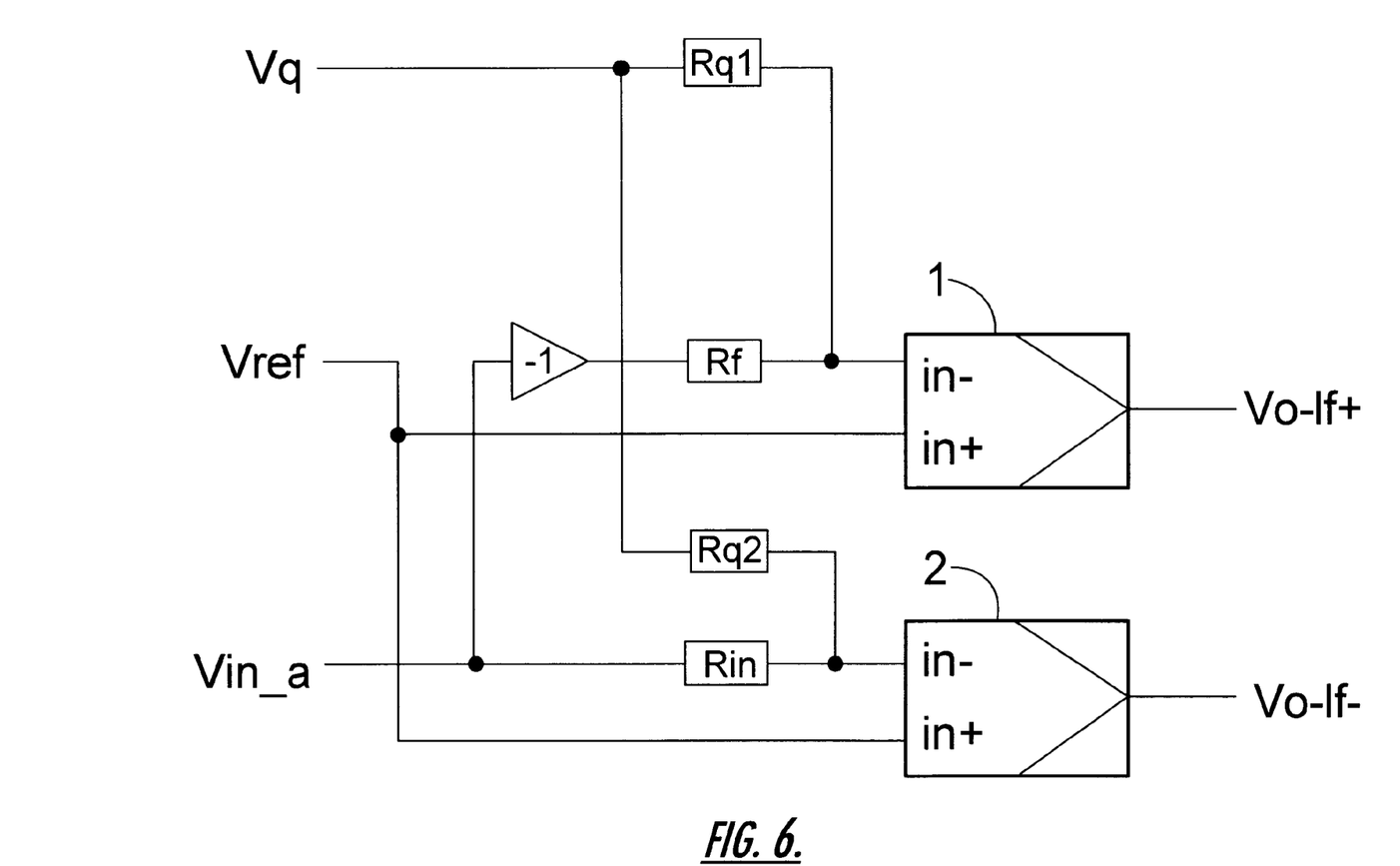
FIG. 6 shows the configuration of the input network for an analog input signal and phase shift PWM output, according to an alternative embodiment.

Alternatively, a similar result of producing a phase shift PWM output may be achieved even with a different configuration of the input network, as shown in FIG. 6. According to this alternative embodiment, the amplifier of the invention provides for two identically inverting signal paths, thereby having the same gain provided that Rf=Rin. The inversion necessary to obtain a low frequency signal in phase opposition to the two amplifier's outputs (Vo−If+ and Vo−If−) is obtained by way of a unit gain inverting amplifier (−1) functionally introduced at the input of the channel relative to the positive output Vo−If+.

Figure 7:
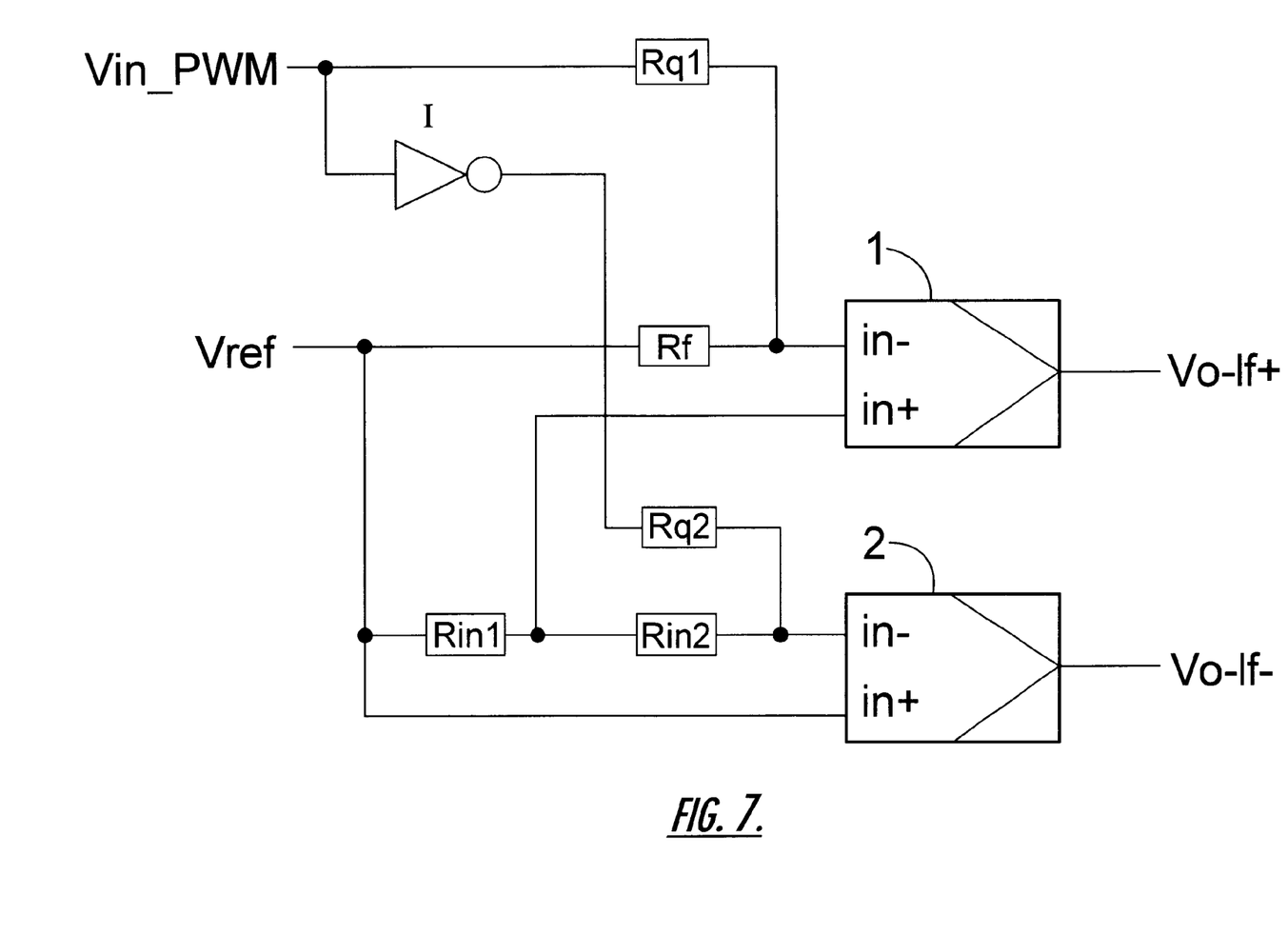
FIG. 7 shows the configuration of the input network for a standard PWM digital input signal and a standard PWM output.

FIG. 7 shows the configuration scheme of the input network of the amplifier of the invention for the case of a standard PWM digital input signal and a standard PWM output. By comparison, it may be seen how the circuit is identical to the circuit of FIG. 4, with the exception of the short circuiting of input Vin a to the fixed reference voltage Vref. The square waveform of the input digital PWM signal is transferred to the output with the same frequency but with a changed duty cycle, depending on the difference between the logic voltage (for example 0–5V) and the supply voltage 0-Vcc. Ideally, the output duty cycle is approximately equal to that of the input in absence of a modulating signal (duty cycle =50%).

Figure 8:
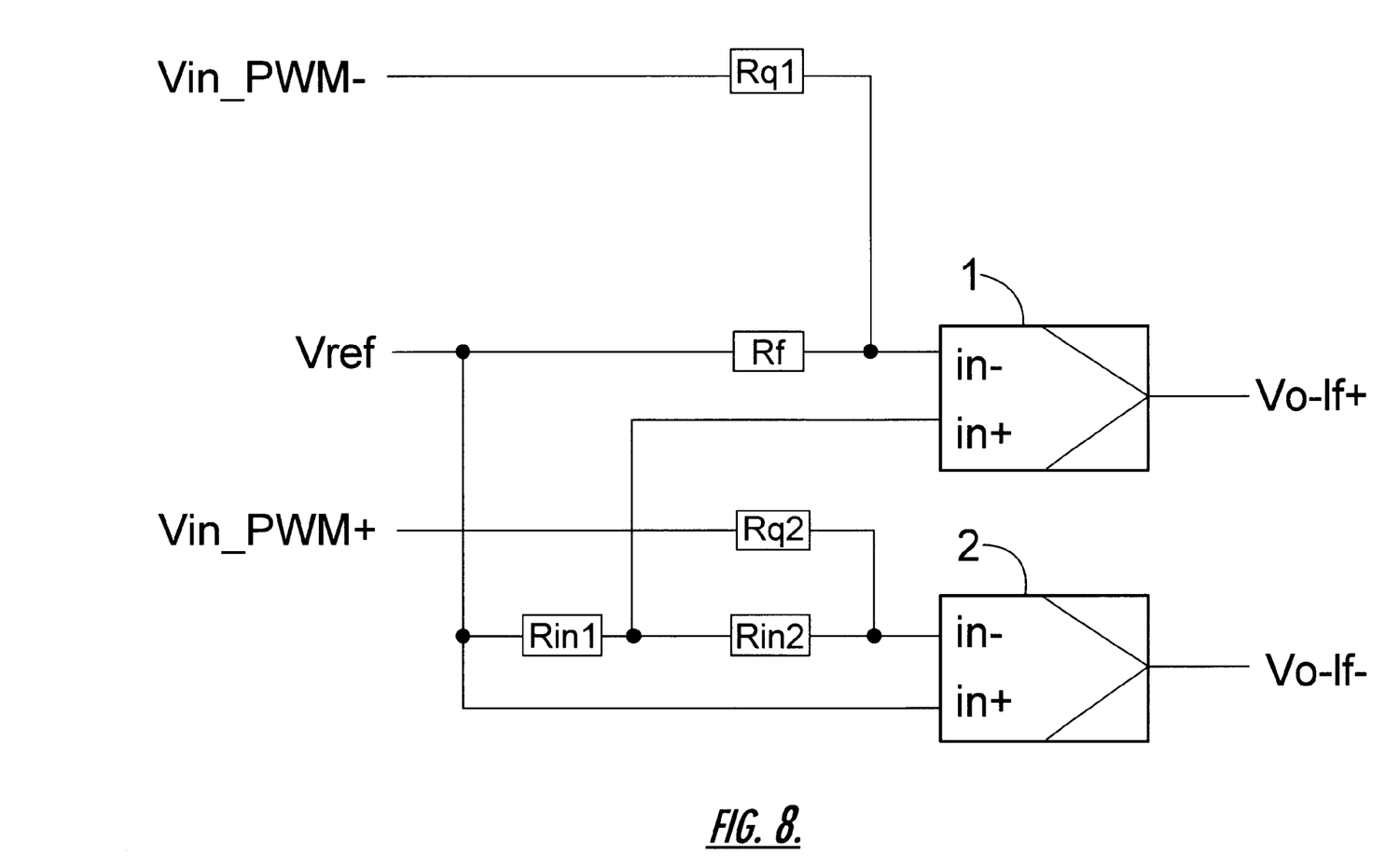
FIG. 8 shows the configuration of the input network for a phase shift PWM digital input signal and a phase shift PWM output.

FIG. 8 shows an alternative diagram of the input network of the amplifier of the invention for the case of a phase shift PWM digital input and a phase shift PWM output. The circuit has the same structure as that of FIG. 5 and may be obtained by simply connecting the node Vin_a to the node Vref, and by applying the differential phase shift PWM digital signal Vin_PWM− and Vin_PWM+, separately via the input resistors Rq1 and Rq2, to the respective inverting inputs in the two amplifying modules 1 and 2.

Figure 9:
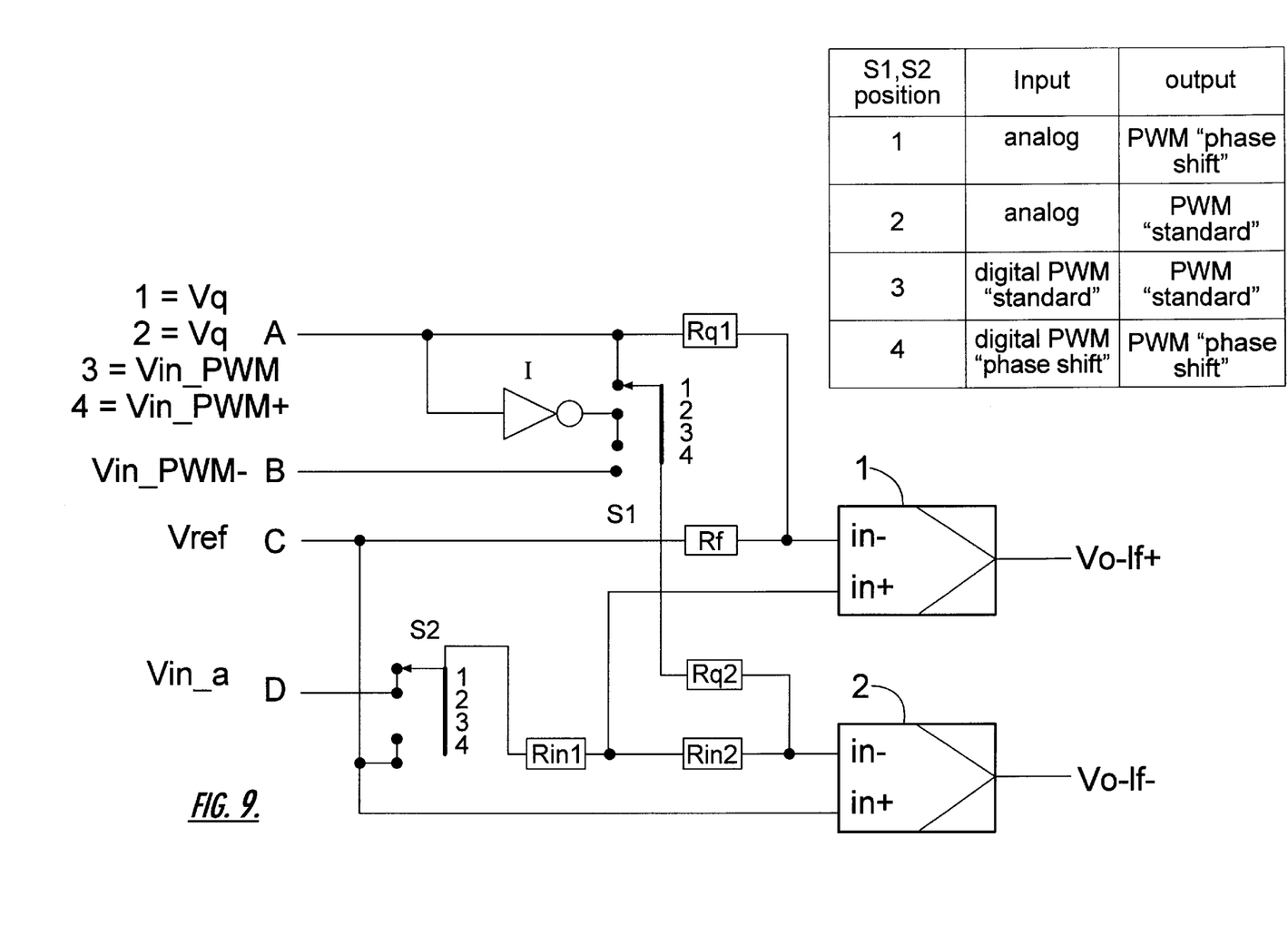
FIG. 9 shows the architecture for selecting the desired input network configuration of the amplifier of the invention.

FIG. 9 shows a possible architecture of an input network for the amplifier of the invention, configurable by a simple selection made by switches for the three different types of input signals, and for the two different types of output signals: standard PWM and phase shift PWM. According to the embodiment of FIG. 9, each possible combination of the type of the input signal and of the type of PWM output signal is selectable by a pair of electronic four-position switches S1, S2. The configurable amplifier of the invention has four input nodes A, B, C, and D to which input signals as specified in the scheme of FIG. 9 may be applied. The side table indicates, for each position of the switches S1 and S2, the selected circuit configuration for the respective types of input signal and/or of PWM output signal.

Figure 10A:
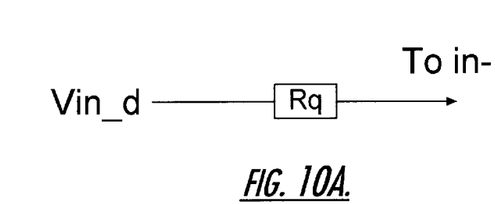
FIGS. 10A and 10B show an alternative embodiment for the case of a digital input signal (Vin_d) using two current generators switched by switches driven by the digital input signal in substitution of the Rq resistors of the input network.
Figure 10B:
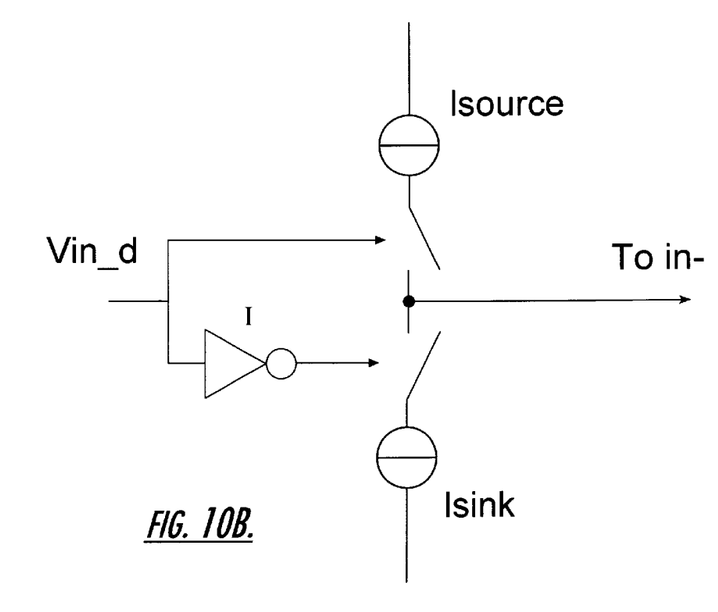

According to an alternative embodiment, each of the resistors Rq1 and Rq2 of the input network (FIG. 10A) may be substituted by a pair of current generators switched by switches driven by the digital input signal, one directly and the other one via an inverter (FIG. 10B).

Figure 11A:
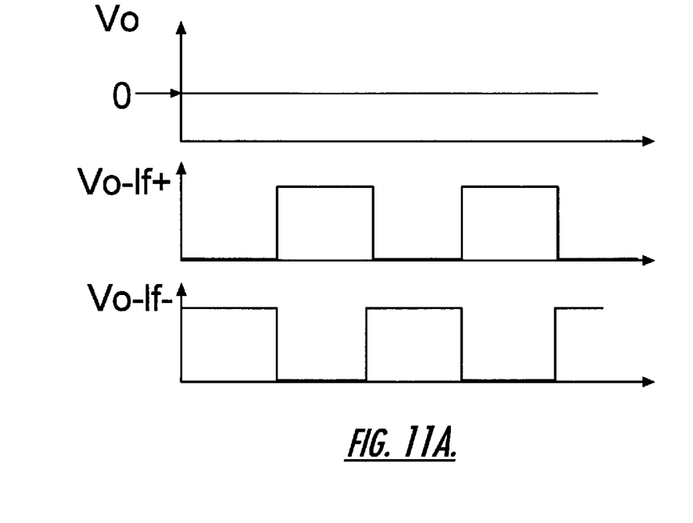
FIGS. 11A–11C illustrate the significative signals in the case of a standard PWM bridge output configuration.
Figure 11B:
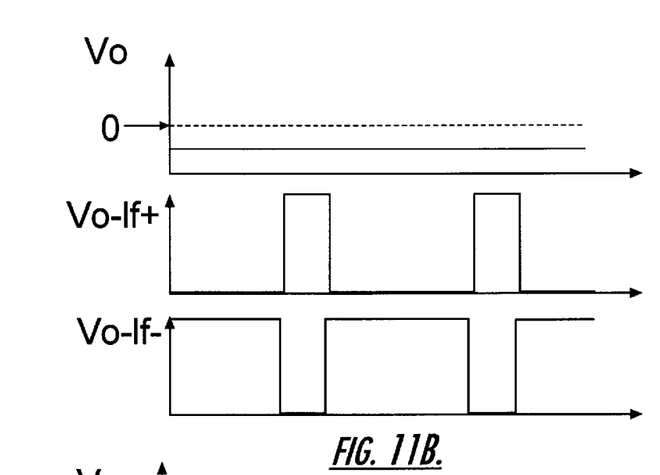
Figure 11C:
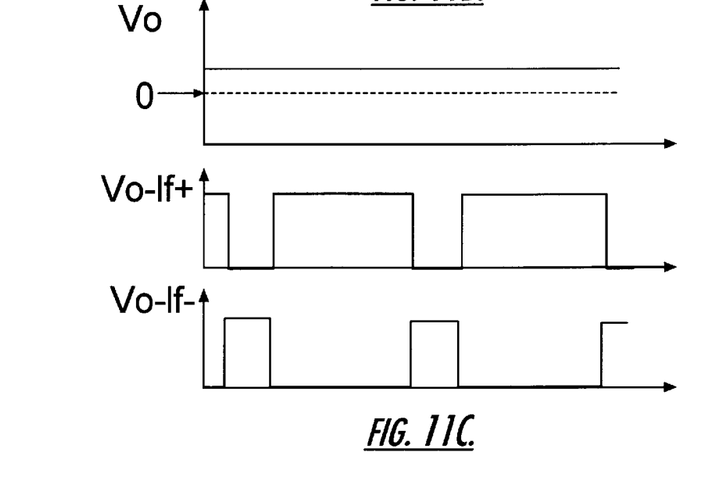
Figure 12A:
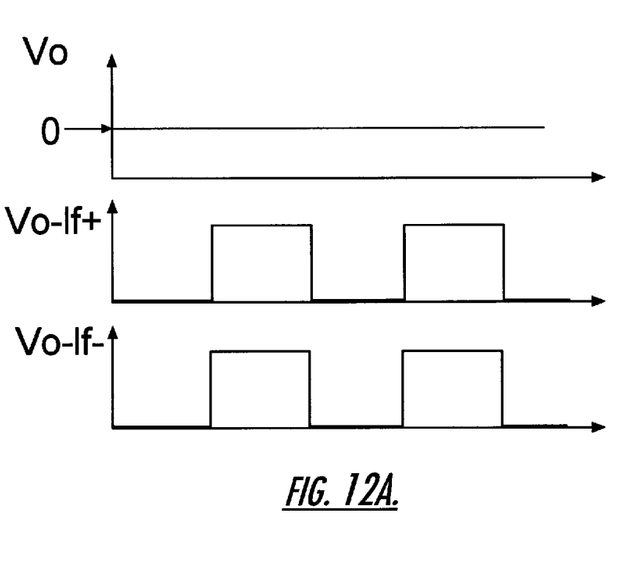
FIGS. 12A–12C illustrate the significant signals in the case of a phase shift PWM bridge output configuration.
Figure 12B:
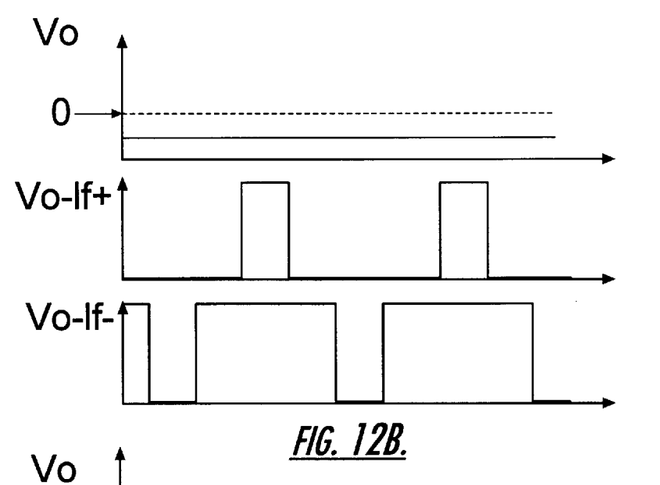
Figure 12C:
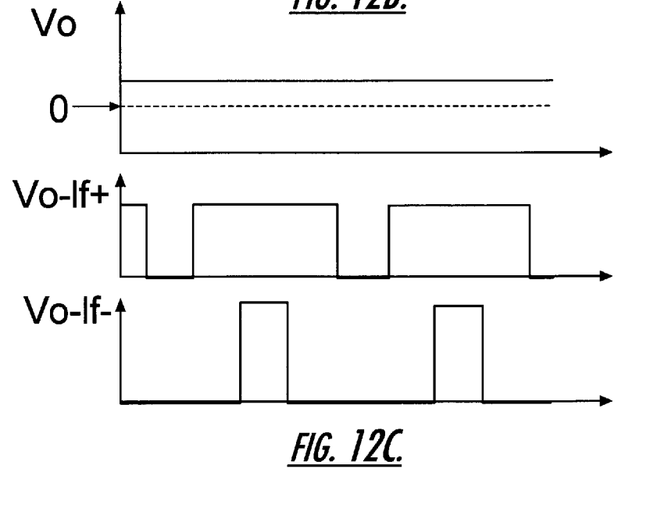

The differences between a standard PWM bridge output and a phase shift PWM bridge output are more readily observed by comparing the waveforms of the signals shown in FIG. 11 for a standard PWM output and in FIG. 12 for a phase shift PWM output and wherein a differential output Vo is taken downstream of a reconstructing filter of the analog audio signal. For a standard PWM output, the PWM waveform present on the two Vo–If+ and Vo–If– outputs of the amplifier is such to present only one phase inversion per clock period.

By contrast, for a phase shift PWM output, the inverted or negative output Vo–If–, besides been inverted is also shifted by half clock period in respect to the direct or positive Vo–If+ output. By considering a differential output, the frequency is twice the clock frequency. Therefore, the PWM carrier may be filtered more easily. Moreover, during null modulation conditions there are no carrier residues on the load terminal (in the ideal case).

That which is claimed is:

1. A low frequency PWM output bridge amplifier for receiving PWM digital input signals, phase shift PWM digital input signals or analog input signals, and for outputting PWM output signals or phase shift PWM output signals, the amplifier comprising:

a configurable input network;

a first amplifying module for a direct PWM output amplifying channel, and including an inverting input connected to the configurable input network for receiving a square wave signal; and a second amplifying module for an inverted PWM output amplifying channel, and including an inverting input connected to the configurable input network for receiving the square wave signal;

each of the first and second amplifying modules comprising a switching output operational amplifier, having a voltage mode noninverting input and a current mode inverting input, and a loop filter connected to the switching output operational amplifier which together define a slope integrator for outputting a signal of a substantially triangular waveform, at least one logic inverter connected to an output of the slope integrator and which outputs a logic PWM signal, an output power stage which converts the logic PWM signal output by the at least one logic inverter to a PWM signal while switching between two supply lines, and a feedback resistor connecting an output of the output power stage to the current mode inverting input of the switching output operational amplifier.

2. An amplifier according to claim 1, wherein the slope integrator comprises one of a single slope integrator and a multiple slope integrator for outputting the signal of the substantially triangular waveform.

3. An amplifier according to claim 1, wherein the at least one logic inverter comprises a plurality of logic inverters.

4. An amplifier according to claim 1, wherein the current mode inverting input of the switching output operational amplifier of each module is biased by a current generator connected between the current mode inverting input and ground, for generating a current as a function of a supply voltage.

5. An amplifier according to claim 1, further comprising a resistive divider of the PWM signal from the output power stage, wherein the feedback resistor is connected to an intermediate node of the resistive divider.

6. An amplifier according to claim 1, wherein the configurable input network comprises:

a first input node for receiving one of a square waveform clock signal for the analog input signal, and a PWM input signal for the PWM digital input signal or the phase shift PWM digital input signal;

a second input node for receiving an inverted PWM digital input signal;

a third input node for receiving a constant reference voltage;

a fourth input node for receiving the analog input signal, the fourth input node being connected in common with the third input node when the first input node receives the PWM digital input signal or the phase shift PWM digital input signal; and first and second four-position switches for selectively connecting the four input nodes to the first and second amplifying modules.

7. A Class-D power amplifier for receiving analog and digital signals, the amplifier comprising:

an input network;

a first amplifying module for a direct PWM output amplifying channel, and including an inverting input connected to the input network for receiving a square wave signal; and a second amplifying module for an inverted PWM output amplifying channel, and including an inverting input connected to the input network for receiving the square wave signal;

each of the first and second amplifying modules comprising an operational amplifier, having a voltage mode noninverting input and a current mode inverting input, a loop filter connected to the operational amplifier which together define a slope integrator for outputting a signal of a substantially triangular waveform, at least one logic inverter connected to an output of the slope integrator and which outputs a logic PWM signal, an output power stage which converts the logic PWM signal output by the at least one logic inverter to a PWM signal, and a feedback resistor connecting an output of the output power stage to the current mode inverting input of the operational amplifier.

8. An amplifier according to claim 7, wherein the slope integrator comprises one of a single slope integrator and a multiple slope integrator for outputting the signal of the substantially triangular waveform.

9. An amplifier according to claim 7, wherein the at least one logic inverter comprises a plurality of logic inverters.

10. An amplifier according to claim 7, wherein the current mode inverting input of the operational amplifier of each module is biased by a current generator connected between the current mode inverting input and ground.

11. An amplifier according to claim 7, further comprising a resistive divider of the PWM signal from the output power stage, wherein the feedback resistor is connected to an intermediate node of the resistive divider.

12. An amplifier according to claim 7, wherein the input network comprises:

a first input node for receiving one of a square waveform clock signal and a PWM digital input signal;

a second input node for receiving an inverted PWM digital input signal;

a third input node for receiving a constant reference voltage;

a fourth input node for receiving an analog input signal, the fourth input node being connected in common with the third input node when the first input node receives the PWM digital input signal; and first and second four-position switches for selectively connecting the four input nodes to the first and second amplifying modules.

13. A method of Class-D power amplification for analog and digital signals, the method comprising the steps of:

providing an input network;

connecting a first amplifying module for a direct PWM output amplifying channel to the input network, the first amplifying module including an inverting input for receiving a square wave signal; and connecting a second amplifying module for an inverted PWM output amplifying channel to the input network, the second amplifying module including an input for receiving the square wave signal;

each of the first and second amplifying modules comprising
- a switching output operational amplifier, having a voltage mode noninverting input, a current mode inverting input and a loop filter which define a slope integrator for outputting a signal of a substantially triangular waveform,
- at least ore logic inverter connected to an output of the slope integrator and which outputs a logic PWM signal,
- an output power stage which converts the logic PWM signal output by the at least one logic inverter to a PWM signal, and
- a feedback resistor connecting an output of the output power stage to the current mode inverting input of the switching output operational amplifier.

14. A method according to claim 13, wherein the slope integrator comprises one of a single slope integrator and a multiple slope integrator for outputting the signal of the substantially triangular waveform.

15. A method according to claim 13, wherein the at least one logic inverter comprises a plurality of logic inverters.

16. A method according to claim 13, further comprising the step of biasing the current mode inverting input of the switching output operational amplifier of each module with a current generator connected between the current mode inverting input and ground.

17. A method according to claim 13, wherein each of the first and second amplifying modules further comprises a resistive divider of the PWM signal from the output power stage, wherein the feedback resistor is connected to an intermediate node of the resistive divider.

18. A method according to claim 13, wherein the step of providing the input network comprises:

providing a first input node for receiving one of a square waveform clock signal and a PWM digital input signal;

providing a second input node for receiving an inverted PWM digital input signal;

providing a third input node for receiving a constant reference voltage;

providing a fourth input node for receiving an analog input signal, the fourth input node being connected in common with the third input node when the first input node receives the PWM digital input signal; and providing first and second four-position switches for selectively connecting the four input nodes to the first and second amplifying modules.

19. A method of Class-D power amplification for analog and digital signals, the method comprising the steps of:

providing an input network;

connecting a first amplifying module for a direct PWM output amplifying channel to the input network, the first amplifying module including an inverting input for receiving a square wave signal; and connecting a second amplifying module for an inverted PWM output amplifying channel to the input network, the second amplifying module including an input for receiving the square wave signal;

each of the first and second amplifying modules comprising an operational amplifier, a loop filter connected to the operational amplifier which together define a slope integrator, at least one logic gate connected to an output of the slope integrator, an output power stage connected to an output of the at least one logic gate, a resistive divider having an intermediate node and connected to an output of the output power stage, and a feedback resistor connected to the intermediate node and to an input of the operational amplifier.

20. A method according to claim 19, wherein the slope integrator comprises one of a single slope integrator and a multiple slope integrator.

21. A method according to claim 19, wherein the at least one logic gate comprises a plurality of logic gates.

22. A method according to claim 19, further comprising the step of biasing the input of the operational amplifier of each module with a current generator.

23. A method according to claim 19, wherein the step of providing the input network comprises:

providing a first input node for receiving one of a square waveform clock signal and a PWM digital input signal;

providing a second input node for receiving an inverted PWM digital input signal;

providing a third input node for receiving a constant reference voltage;

providing a fourth input node for receiving an analog input signal, the fourth input node being connected in common with the third input node when the first input node receives the PWM digital input signal; and providing first and second four-position switches for selectively connecting the four input nodes to the first and second amplifying modules.

24. A Class-D power amplifier for receiving analog and digital signals, the amplifier comprising:

an input network;

a first amplifying module for a direct PWM output amplifying channel, and connected to the input network;

a second amplifying module for an inverted PWM output amplifying channel, and connected to the input network; and each of the first and second amplifying modules comprising
- an operational amplifier,
- a loop filter connected to the operational amplifier which together define a slope integrator,
- at least one logic gate connected to an output of the slope integrator,
- an output power stage connected to an output of the logic gate, a resistive divider having an intermediate node and connected to the output of the output power stage, and a feedback resistor connected to the intermediate node and to an input of the operational amplifier.

25. An amplifier according to claim 24, wherein the slope integrator comprises one of a single slope integrator and a multiple slope integrator.

26. An amplifier according to claim 24, wherein the at least one logic gate comprises a plurality of logic gates.

27. An amplifier according to claim 24, wherein the input of the operational amplifier of each module is biased by a current generator.

28. An amplifier according to claim 24, wherein the input network comprises:

a first input node for receiving one of a square waveform clock signal and a PWM digital input signal;

a second input node for receiving an inverted PWM digital input signal;

a third input node for receiving a constant reference voltage;

a fourth input node for receiving an analog input signal, the fourth input node being connected in common with the third input node when the first input node receives the PWM digital input signal; and first and second four-position switches for selectively connecting the four input nodes to the first and second amplifying modules.

29. A Class-D power amplifier for receiving analog and digital signals, the amplifier comprising:

a first amplifying module for a direct PWM output amplifying channel; and a second amplifying module for an inverted PWM output amplifying channel;

an input network connected to the first and second amplifying modules and comprising a first input node for receiving one of a square waveform clock signal and a PWM digital input signal, a second input node for receiving an inverted PWM digital input signal, a third input node for receiving a constant reference voltage, a fourth input node for receiving an analog input signal, the fourth input node being connected in common with the third input node when the first input node receives the PWM digital input signal, and first and second four-position switches for selectively connecting the four input nodes to the first and second amplifying modules.

30. An amplifier according to claim 29, wherein each of the first and second amplifying modules comprises:

an operational amplifier;

a loop filter connected to the operational amplifier which together define a slope integrator;

at least one logic gate connected to an output of the slope integrator;

an output power stage connected to an output of the logic gate; and a feedback resistor connecting an output of the output power stage to an input of the operational amplifier.

31. An amplifier according to claim 29, wherein the slope integrator comprises one of a single slope integrator and a multiple slope integrator.

32. An amplifier according to claim 29, wherein the at least one logic gate comprises a plurality of logic gates.

33. An amplifier according to claim 29, further comprising a resistive divider having an intermediate node and connected to the output of the output power stage, wherein the feedback resistor is connected to the intermediate node of the resistive divider.

* * * * *

UNITED STATES PATENT AND TRADEMARK OFFICE
CERTIFICATE OF CORRECTION

PATENT NO. : 6,307,431 B1  Page 1 of 1
DATED : October 23, 2001
INVENTOR(S) : Edoardo Botti, Antonio Grosso and Marco Masini It is certified that error appears in the above-identified patent and that said Letters Patent is hereby corrected as shown below:

Column 1,
Line 57, delete "selfoscillating" insert -- self-oscillating --

Column 3,
Line 15, delete "may be include a" insert -- may include a --
Line 23, delete "two-slopes" insert -- two-slope --

Column 4,
Line 34, delete "Vin a" insert -- Vin_a --

Column 7,
Line 30, delete "at least ore logic" insert -- at least one logic --

Signed and Sealed this

Ninth Day of April, 2002

Attest:

Attesting Officer

JAMES E. ROGAN
Director of the United States Patent and Trademark Office